(12) United States Patent
McIntyre

(10) Patent No.: US 8,031,330 B2
(45) Date of Patent: Oct. 4, 2011

(54) MIXED POLARIZATION STATE MONITORING

(75) Inventor: Gregory R. McIntyre, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 577 days.

(21) Appl. No.: 12/189,340

(22) Filed: Aug. 11, 2008

(65) Prior Publication Data
US 2010/0033703 A1 Feb. 11, 2010

(51) Int. Cl.
*G03B 27/32* (2006.01)
*G03B 27/42* (2006.01)
*G03B 27/54* (2006.01)
*G03B 27/72* (2006.01)

(52) U.S. Cl. .................. 355/77; 355/53; 355/67; 355/71

(58) Field of Classification Search ............... 250/492.2; 355/53, 55, 67–68, 71, 77; 356/364–370, 356/399–401; 430/5, 30
See application file for complete search history.

(56) References Cited

U.S. PATENT DOCUMENTS

| | | | |
|---|---|---|---|
| 7,224,458 B2 | 5/2007 | McIntyre et al. | |
| 2006/0250615 A1* | 11/2006 | Fukuhara | 356/364 |

* cited by examiner

*Primary Examiner* — Hung Henry Nguyen
*Assistant Examiner* — Colin Kreutzer
(74) *Attorney, Agent, or Firm* — Wenjie Li; Hoffman Warnick LLC

(57) ABSTRACT

Mixed polarization state monitoring is presented. One method may include selecting a set of total dose values, and for each total dose value: exposing a location on a photoresist using illumination having an x-polarization value with an x-exposure dose ratio value of the total dose value, exposing the location on the photoresist using illumination having a y-polarization value with a y-exposure dose ratio value of the total dose value, and repeating the x-polarization value exposing and the y-polarization value exposing to achieve a range of mixed polarization states and a plurality of dose ratio values that range over extremes for the x-polarization exposure and the y-polarization exposure, each repeating occurring at a different location on the photoresist; and monitoring which mixed polarization states causes a change in an image printed at the different locations in the photoresist.

18 Claims, 8 Drawing Sheets

Exposure A (X polarization)

| | Col 1 | Col 2 | Col 3 | Col 4 | Col 5 | Col 6 | Col 7 |
|---|---|---|---|---|---|---|---|
| | DT1 | DT2 | DT3 | DT4 | DT5 | DT6 | DT7 |
| %CF | 0.60 | 0.70 | 0.80 | 0.90 | 1.00 | 1.10 | 1.20 |
| xEo | 1.67 | 1.43 | 1.25 | 1.11 | 1.00 | 0.91 | 0.83 |
| DT | 54.99 | 47.14 | 41.25 | 36.66 | 33.00 | 30.00 | 27.50 |
| start dose | 54.99 | 47.14 | 41.25 | 36.66 | 33.00 | 30.00 | 27.50 |
| Step | -2.750 | -2.357 | -2.062 | -1.833 | -1.650 | -1.500 | -1.375 |

160X

| Col 1 | Col 2 | Col 3 | Col 4 | Col 5 | Col 6 | Col 7 |
|---|---|---|---|---|---|---|
| 55.0 | 47.1 | 41.2 | 36.7 | 33.0 | 30.0 | 27.5 |
| 52.2 | 44.8 | 39.2 | 34.8 | 31.3 | 28.5 | 26.1 |
| 49.5 | 42.4 | 37.1 | 33.0 | 29.7 | 27.0 | 24.7 |
| 46.7 | 40.1 | 35.1 | 31.2 | 28.0 | 25.5 | 23.4 |
| 44.0 | 37.7 | 33.0 | 29.3 | 26.4 | 24.0 | 22.0 |
| 41.2 | 35.4 | 30.9 | 27.5 | 24.7 | 22.5 | 20.6 |
| 38.5 | 33.0 | 28.9 | 25.7 | 23.1 | 21.0 | 19.2 |
| 35.7 | 30.6 | 26.8 | 23.8 | 21.4 | 19.5 | 17.9 |
| 33.0 | 28.3 | 24.7 | 22.0 | 19.8 | 18.0 | 16.5 |
| 30.2 | 25.9 | 22.7 | 20.2 | 18.1 | 16.5 | 15.1 |
| 27.5 | 23.6 | 20.6 | 18.3 | 16.5 | 15.0 | 13.7 |
| 24.7 | 21.2 | 18.6 | 16.5 | 14.8 | 13.5 | 12.4 |
| 22.0 | 18.9 | 16.5 | 14.7 | 13.2 | 12.0 | 11.0 |
| 19.2 | 16.5 | 14.4 | 12.8 | 11.5 | 10.5 | 9.6 |
| 16.5 | 14.1 | 12.4 | 11.0 | 9.9 | 9.0 | 8.2 |
| 13.7 | 11.8 | 10.3 | 9.2 | 8.2 | 7.5 | 6.9 |
| 11.0 | 9.4 | 8.2 | 7.3 | 6.6 | 6.0 | 5.5 |
| 8.2 | 7.1 | 6.2 | 5.5 | 4.9 | 4.5 | 4.1 |
| 5.5 | 4.7 | 4.1 | 3.7 | 3.3 | 3.0 | 2.7 |
| 2.7 | 2.4 | 2.1 | 1.8 | 1.6 | 1.5 | 1.4 |
| 0.0 | 0.0 | 0.0 | 0.0 | 0.0 | 0.0 | 0.0 |

164X

| S1/S0 | EA |
|---|---|
| 1.00 | 1.00 |
| 0.90 | 0.95 |
| 0.80 | 0.90 |
| 0.70 | 0.85 |
| 0.60 | 0.80 |
| 0.50 | 0.75 |
| 0.40 | 0.70 |
| 0.30 | 0.65 |
| 0.20 | 0.60 |
| 0.10 | 0.55 |
| 0.00 | 0.50 |
| -0.10 | 0.45 |
| -0.20 | 0.40 |
| -0.30 | 0.35 |
| -0.40 | 0.30 |
| -0.50 | 0.25 |
| -0.60 | 0.20 |
| -0.70 | 0.15 |
| -0.80 | 0.10 |
| -0.90 | 0.05 |
| -1.00 | 0.00 |

FIG. 4

| | | | | | | | | | | | | | | | | | | | |
|---|---|---|---|---|---|---|---|---|---|---|---|---|---|---|---|---|---|---|---|
|0.96|0.92|0.87|0.82|0.78|0.73|0.68|0.64|0.59|0.54|0.50|0.45|0.41|0.36|0.31|0.27|0.22|0.17|0.13|0.08|0.03|
|0.97|0.92|0.87|0.83|0.78|0.73|0.69|0.64|0.59|0.55|0.50|0.45|0.41|0.36|0.31|0.27|0.22|0.17|0.12|0.08|0.03|
|0.97|0.92|0.88|0.83|0.78|0.74|0.69|0.64|0.59|0.55|0.50|0.45|0.41|0.36|0.31|0.26|0.22|0.17|0.12|0.08|0.03|
|0.96| |0.86|0.82|0.77|0.72| |0.63| |0.54|0.49|0.44|0.40|0.35|0.31|0.26|0.21|0.17|0.12|0.07|0.03|
|0.98|0.93|0.88|0.83|0.79| |0.69|0.64|0.59|0.55| |0.45|0.40|0.36|0.31|0.26|0.21|0.17|0.12|0.07|0.02|
|0.98|0.93|0.88| |0.79|0.74|0.69|0.64| |0.55| |0.45|0.40| |0.31|0.26|0.21|0.16|0.12|0.07|0.02|
|0.98|0.93|0.89|0.84|0.79|0.74|0.69|0.64|0.60|0.55|0.50|0.45|0.40|0.36|0.31|0.26|0.21|0.16|0.11|0.07|0.02|

FIG. 6

MIXED POLARIZATION STATE MONITORING

BACKGROUND

1. Technical Field

The disclosure relates generally to integrated circuit (IC) chip fabrication, and more particularly, to photolithography illumination polarization monitoring.

2. Background Art

Current photolithographic scanners used in IC chip fabrication provide engineered illumination polarization states in order to provide enhanced imaging performance and process latitude. Knowledge of the polarization state of the illumination is important in order to provide the enhanced imaging performance. Although on-board metrology is being developed by scanner vendors, no commercially available method currently exists to independently monitor and/or measure these polarization states.

SUMMARY

Mixed polarization state monitoring is presented. One method may include selecting a set of total dose values, and for each total dose value: exposing a location on a photoresist using illumination having an x-polarization value with an x-exposure dose ratio value of the total dose value, exposing the location on the photoresist using illumination having a y-polarization value with a y-exposure dose ratio value of the total dose value, and repeating the x-polarization value exposing and the y-polarization value exposing to achieve a range of mixed polarization states and a plurality of dose ratio values that range over extremes for the x-polarization exposure and the y-polarization exposure, each repeating occurring at a different location on the photoresist; and monitoring which mixed polarization states causes a change in an image printed at the different locations in the photoresist.

A first aspect of the disclosure provides a method comprising: providing a photolithography scanner capable of providing illumination in x-polarization, y-polarization or un-polarized states; selecting a set of total dose values, and for each total dose value: exposing a location on a photoresist using illumination having an x-polarization value with an x-exposure dose ratio value of the total dose value, exposing the location on the photoresist using illumination having a y-polarization value with a y-exposure dose ratio value of the total dose value, and repeating the x-polarization value exposing and the y-polarization value exposing to achieve a range of mixed polarization states and a plurality of dose ratio values that range over extremes for the x-polarization exposure and the y-polarization exposure, each repeating occurring at a different location on the photoresist; and monitoring which mixed polarization states causes a change in an image printed at the different locations in the photoresist.

A second aspect of the disclosure provides a system comprising: a photolithography scanner capable of providing illumination in an x-polarization, a y-polarization or an un-polarized state; a dose selector for selecting a set of total dose values; a controller for controlling the photolithography scanner to perform for each total dose value: exposing a location on a photoresist using illumination having an x-polarization value with an x-exposure dose ratio value of the total dose value, exposing the location on the photoresist using illumination having a y-polarization value with a y-exposure dose ratio value of the total dose value, and repeating the x-polarization value exposing and the y-polarization value exposing to achieve a range of mixed polarization states and a plurality of dose ratio values that range over extremes for the x-polarization exposure and the y-polarization exposure, each repeating occurring at a different location on the photoresist; and a monitor for monitoring which mixed polarization states causes a change in an image printed at a location in the photoresist.

A third aspect of the disclosure provides a program product stored on a computer-readable medium, which when executed, determines mixed polarization states that print an image using a given mask and a photolithography scanner capable of providing illumination over a range of mixed polarization states between extremes of x-polarization and y-polarization, the program product comprising program code configured to perform the following: select a set of total dose values, and for each total dose value: control exposing of a location on a photoresist using illumination having an x-polarization value with an x-exposure dose ratio value of the total dose value, control exposing the location on the photoresist using illumination having a y-polarization value with a y-exposure dose ratio value of the total dose value, repeat the x-polarization value exposing and the y-polarization value exposing to achieve a range of mixed polarization states and a plurality of dose ratio values that range over extremes for the x-polarization exposure and the y-polarization exposure, each repeating occurring at a different location on the photoresist; and monitor which mixed polarization states causes a change in an image printed at the different locations in the photoresist.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 4-6 show graphs illustrating embodiments of the method according to the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Polarization is a property of transverse waves which describes the orientation of the oscillations in the plane perpendicular to the wave's direction of travel. In terms of light, polarization refers to the direction of the wave's oscillating electric field. Depending on the coordinate system used, polarization can be stated in terms of, for example, x or y direction. Throughout the description, polarization states shall be described in x or y coordinates. It is understood that the teachings of the disclosure are applicable to other coordinate systems. State of the art photolithography scanner systems used to form IC chips can generate two different polarization states of illumination (e.g., x or y). This polarized illumination is used with conventional photomasks to improve the process latitude in the printing of features used to create structures on IC chip materials. Although scanners can only expose with X or Y polarization in a single exposure, this disclosure employs a double exposure technique to create any combination of polarization states, e.g., 60% x and 40% y. In U.S. Pat. No. 7,224,458, a set of test structures on a specialized multi-phase shift test mask are used, which when exposed to create a pattern in resist, the dose that causes a center of the image to print depends on the polarization state of the illumination. For example, if two multi-phase shift test mask patterns with opposite polarity by being orthogonal to one another are illuminated with one polarization state, one pattern will print with a much higher dose than the other pattern. The intensity at the image center depends on the illumination's polarization state. The method according to the disclosure determines the intensity at this point in the image. This information is used to quantify the polarization state for the portion of the illuminator that is responsible for exposing the test pattern of interest. Details of how this quantification is done are found in U.S. Pat. No. 7,224,458. The intent is to characterize the polarization of the illumination system, so that enhanced imaging performance, process latitude, and across chip uniformity can be achieved.

Figure 1:
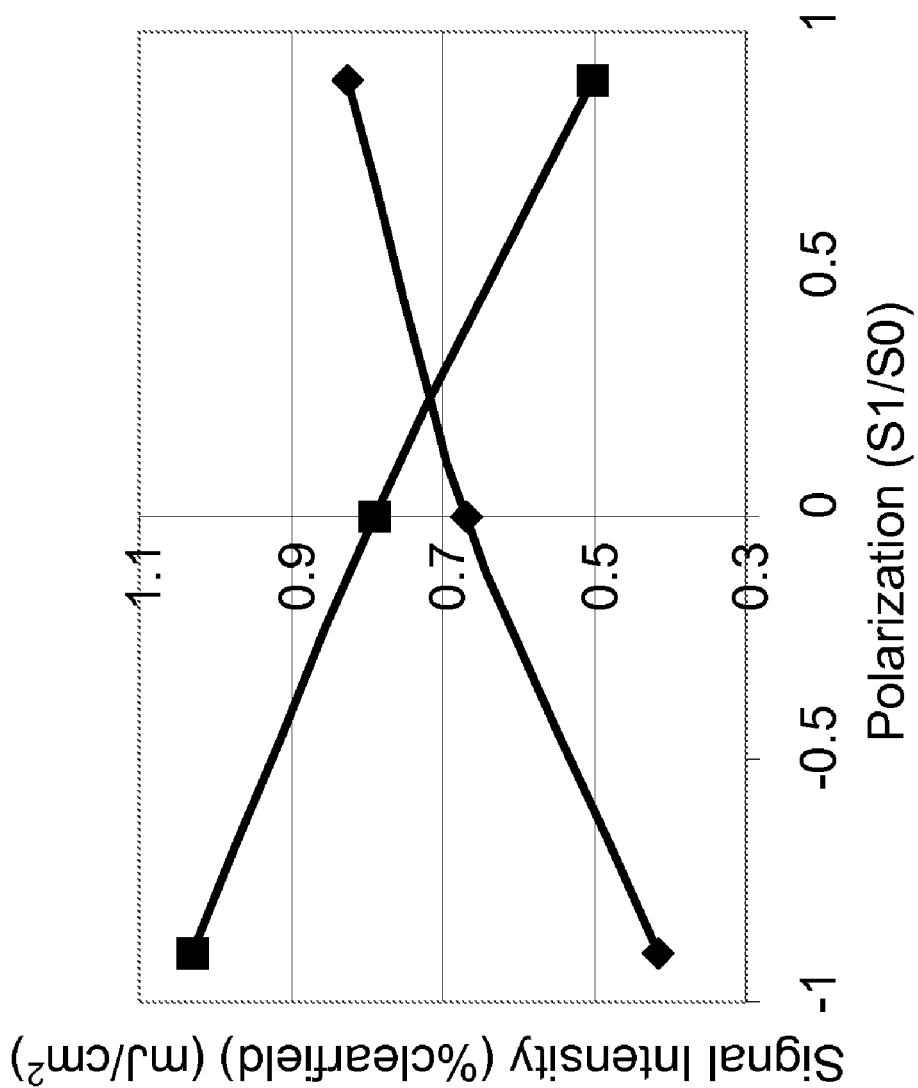
FIG. 1 shows a graph illustrating data from a conventional technique for monitoring images that print using different polarization illumination.

FIG. 1 shows a chart of signals of an x-polarization monitor and a y-polarization monitor versus changes in the polarization of illumination received by the two monitors. For example, the x-polarization may oscillate up-and-down, while the y-polarization may oscillate left-to-right. Conventional photolithographic scanners could only illuminate using x-polarization or y-polarization or un-polarized light (equal parts x and y polarization). In this case, measurements of data points used to determine when an image printed would include exposing locations on the photoresist using x-polarization illumination at a large range of increasing dose values and collecting data as to when the pattern printed. This process would be repeated for y-polarization illumination and also for un-polarized illumination. As shown in FIG. 1, only 3 data points are achieved for each of the x-polarization monitor and the y-polarization monitor using this technique, i.e., one at each polarization extreme (x or y polarization) and one at the un-polarized state (equal mix of x and y) for each monitor.

However, the above-described methodology often does not provide an adequate measurement. The method according to the disclosure uses a double exposure scheme in which one exposure uses x-polarized light and another exposure uses y-polarized light at the same location. Varying the ratios of doses for those two exposures allows data collection for any polarization state between the extremes.

Figure 2:
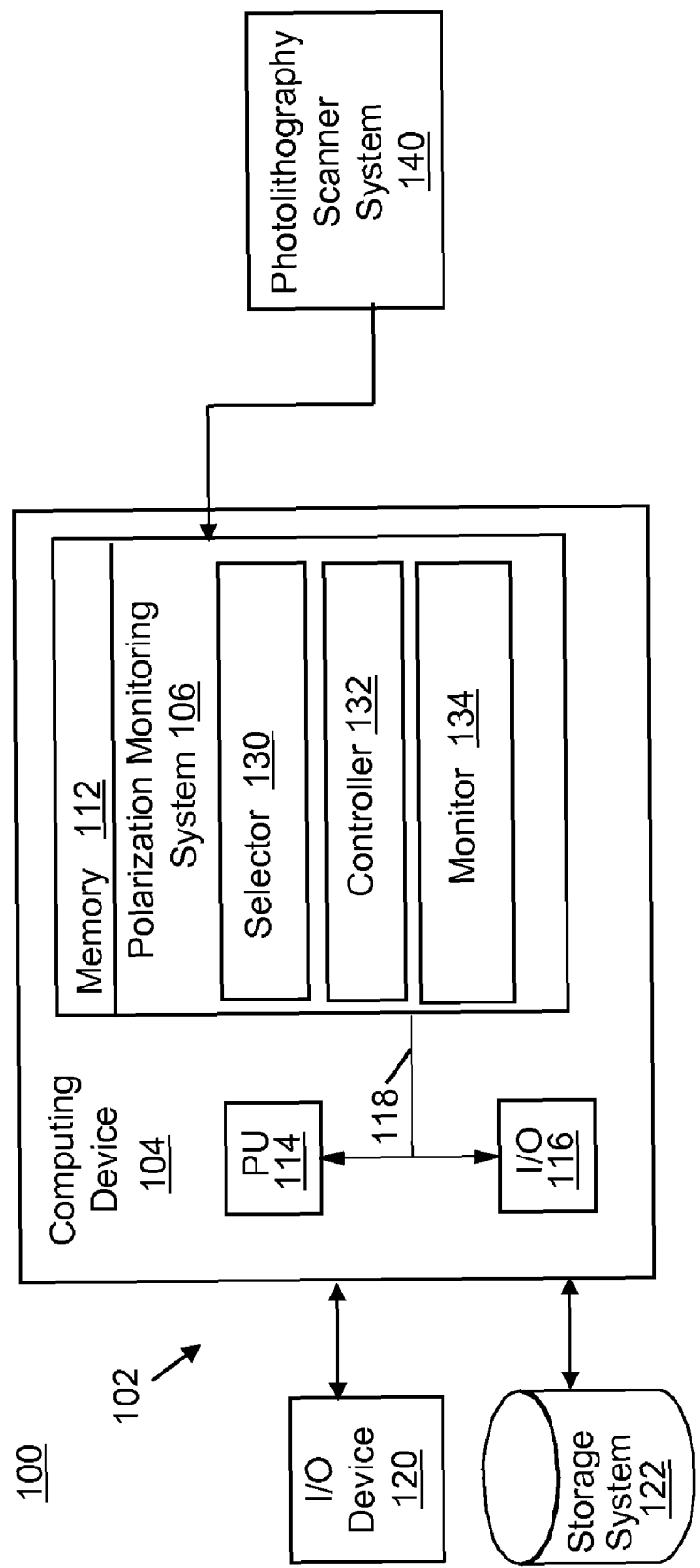
FIG. 2 shows a block diagram of embodiments of a system according to the disclosure.

FIG. 2 shows an illustrative environment 100 for mixed polarization state monitoring. To this extent, environment 100 includes a computer infrastructure 102 that can perform the various process steps described herein for monitoring mixed polarization states. In particular, computer infrastructure 102 is shown including a computing device 104 that comprises a polarization monitoring system 106, which enables computing device 104 to perform the processes of the disclosure. In one embodiment, polarization monitoring system 106 and/or computer infrastructure 102 may be implemented as part of a photolithography scanner 140.

Computing device 104 is shown including a memory 112, a processor (PU) 114, an input/output (I/O) interface 116, and a bus 118. Further, computing device 104 is shown in communication with an external I/O device/resource 120 and a storage system 122. As is known in the art, in general, processor 114 executes computer program code, such as polarization monitoring system 106, that is stored in memory 112 and/or storage system 122. While executing computer program code, processor 114 can read and/or write data to/from memory 112, storage system 122, and/or I/O interface 116. Bus 118 provides a communications link between each of the components in computing device 104. I/O device 118 can comprise any device that enables a user to interact with computing device 104 or any device that enables computing device 104 to communicate with one or more other computing devices. Input/output devices (including but not limited to keyboards, displays, pointing devices, etc.) can be coupled to the system either directly or through intervening I/O controllers.

In any event, computing device 104 can comprise any general purpose computing article of manufacture capable of executing computer program code installed by a user (e.g., a personal computer, server, handheld device, etc.). However, it is understood that computing device 104 and polarization monitoring system 106 are only representative of various possible equivalent computing devices that may perform the various process steps of the disclosure. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For example, in one embodiment, computer infrastructure 102 comprises two or more computing devices (e.g., a server cluster) that communicate over any type of wired and/or wireless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

Polarization monitoring system (PMS) 106 is shown including a selector 130, a controller 132 and a monitor 134. As understood, monitor 134 may include an x-polarization monitor and a y-polarization monitor. Although one type of polarization monitor is used for illustration in this disclosure, various embodiments may be used to provide the basic function of a polarimeter, as described below. Polarimetry, the measurement of the polarization characteristics of light, exists in various forms in many fields of optics. A typical polarimeter consists of an intensity detector and an analyzer, which is often the combination of a wave-plate rotator and a polarizer. By positioning the rotator and polarizer in a series of different orientations and recording the intensities allowed to pass to the detector, the polarization characteristics of the incident light beam may be inferred. To account for imperfections in the optical elements, calibration of the system is typically required by illuminating it with a set of known polarization states. The measured Stokes vector ($S_m$) describes polarization and can be determined from the series of intensity measurements at each analyzer configuration (described in the vector F) and a calibration matrix (W) as $$S_m = W^{-1} F \qquad \text{Eq. 1}$$

A polarimeter may adapt to this procedure by using a set of chromeless phase shifting mask patterns as the analyzer and photoresist as the intensity detector. A pattern, derived from high-NA proximity effects described in U.S. Pat. No. 7,224,458, scatters light to high-angle spatial frequencies, creating a central image intensity dependent only on the local state of polarization. For vertically polarized light, the two orthogonal patterns require different dose values for the resist to clear at the center of the images. This clearing dose, when converted to a percent of the clear field intensity, is considered the measurement signal. To monitor polarization of oblique imaging rays, a four-phase linear grating may be incorporated within the rings. Although patterns are more difficult to manufacture and suffer from stronger electromagnetic effects, the signal is deteriorated by only about 35 to 50% when compared with the on-axis monitors.

Operation of each of the systems of FIG. 2 is discussed further below. However, it is understood that some of the various systems shown in FIG. 2 can be implemented independently, combined, and/or stored in memory for one or more separate computing devices that are included in computer infrastructure 102. Further, it is understood that some of the systems and/or functionality may not be implemented, or additional systems and/or functionality may be included as part of environment 100.

Figure 3:
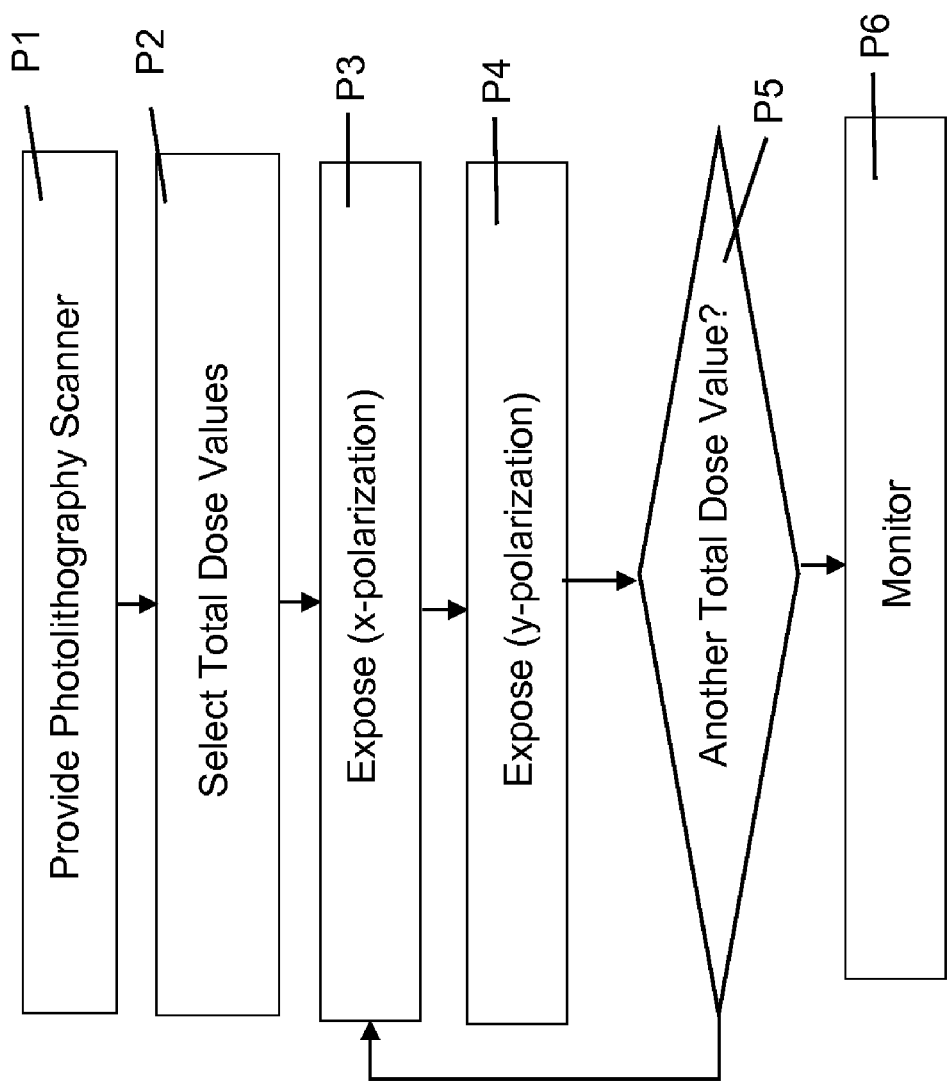
FIG. 3 shows a flow diagram of embodiments of a method according to the disclosure.

FIG. 3 shows a flow diagram of embodiments of a method according to the disclosure. Referring to FIGS. 2-3 collectively, in process P1, a photolithography scanner 140 capable of providing X, Y or un-polarized illumination is provided. Photolithography scanner 140 may be any now known or later developed photolithography system capable of providing illumination over a range of mixed polarization states between extremes of x-polarization and y-polarization. That is, photolithography scanner 140 may provide illumination that is not simply x-polarization alone, y-polarization alone or un-polarized, but unequal mixes of x-polarization and y-polarization.

In process P2, selector 130 selects a set of total dose values. This process may occur in a number of user-defined ways. In one embodiment, however, the set of total dose values is selected by determining a plurality of dose values. For example, a plurality of desired percentage clear field levels may be chosen by a user. Next, selector 130 may convert each of the plurality of dose values to a total dose value based on a clearing dose of the photoresist (E0), an overdose factor of the photolithography scanner and an effective pinhole size of a mask used. More specifically, a total dose value may be calculated according to:

$$\text{Total dose} = E0 * OD\text{factor}/\% \text{ clearfield} \qquad \text{Equation 1}$$

where E0 is a clearing dose of the photoresist, ODfactor is an overdose factor and % clearfield is a particular dose value (i.e., measured in percentage clearfield). The overdose factor may be calculated according to:

$$OD\text{factor} = \text{area of illuminator}/(pi * \sigma\text{pinhole}^2) \qquad \text{Equation 2}$$

where area of illuminator is an area illuminated by photolithography scanner relative to the total area of the projection lens pupil 140 and σpinhole is an effective illumination area (sigma) resulting from a pinhole on the backside of the test mask used for the monitoring. σpinhole may be calculated according to:

$$\sigma_{pinhole} = \frac{M \cdot n_g}{NA} \sin(\arctan(r_{pinhole} t_{mask})) \qquad \text{Equation 3}$$

where M=magnification of photolithography scanner 140, ng=index of refraction of a mask blank, NA=numerical aperture of photolithography scanner 140, $r_{pinhole}$=radius of backside pinhole (μm) and $t_{mask}$=a thickness of the mask (μm). Other manners of determining a set of total dose values may also be employed.

In process P3-P5, for each total dose value, controller 132 controls photolithography scanner 140 to perform the following. In process P3, controller 132 controls photolithography scanner 144 to expose a location on a photoresist using illumination having an x-polarization value with an x-exposure dose ratio value of the total dose value. In process P4, controller 132 controls photolithography scanner 144 to expose the location on the photoresist using illumination having a y-polarization value with a y-exposure dose ratio value of the total dose value. In process P5, controller 132 controls photolithography scanner 144 to repeat the x-polarization value exposing and the y-polarization value exposing over a range of mixed polarization states and a plurality of dose ratio values that range over extremes for the x-polarization exposure and the y-polarization exposure. Each repeating of the double exposure occurs at a different location on the photoresist. As will be described in greater detail herein, monitoring which mixed polarization states causes an image center to print at the different locations on the photoresist allows for, among other things, customization of the mixed polarization states.

Figure 5:
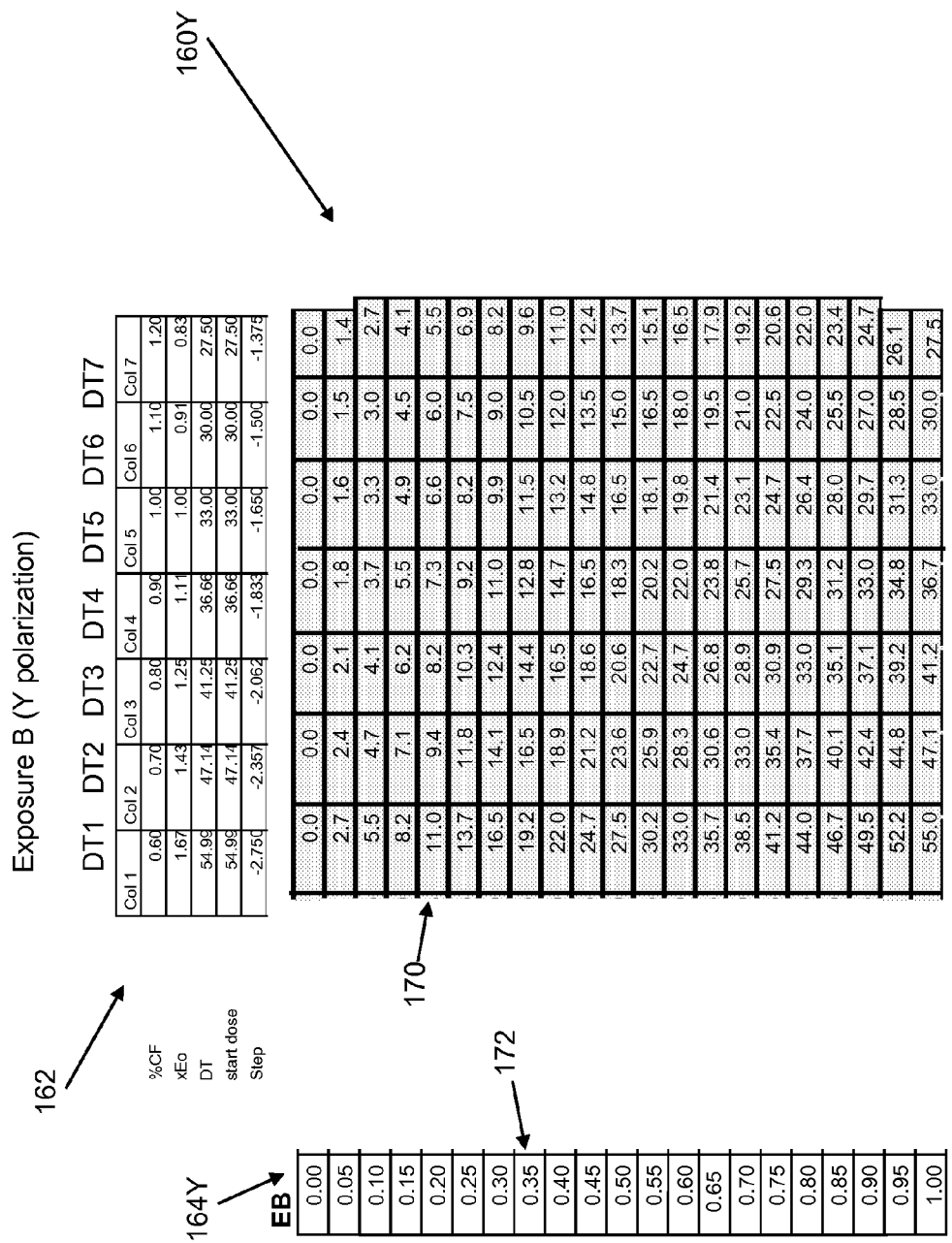

Turning to the details of the double exposure, processes P3 and P4, FIGS. 4 and 5 show graphically the different polarization and dose ratio values used over different photoresist locations for an example case. Each figure includes a chart 160X, 160Y that illustrates different locations (cells on chart) on a photoresist exposed using the double exposure technique described herein. The cells on chart 160X match those on chart 160Y and represent locations on the photoresist exposed to the double exposure of processes P3 and P4. The values shown at each location are the respective dose value used for that location. That is, a portion of the total dose value DT used for the x-polarization exposure (FIG. 4) and the y-polarization exposure (FIG. 5). Chart 162, which is identical in FIGS. 4 and 5, shows the set of total dose values (DT1-DT6) selected by selector 130. Each total dose value corresponds to a particular column in chart 160X, 160Y. In the example shown, DT1 has a value of 54.99 mJ/cm² (3rd row down in chart), DT2 has a value of 47.14 mJ/cm², DT3 has a value of 41.25 mJ/cm², DT4 has a value of 36.66 mJ/cm², DT5 has a value of 33.00 mJ/cm², DT6 has a value of 30.00 mJ/cm² and DT7 has a value of 27.50 mJ/cm². Consequently, the sum of corresponding cells in charts 160X and 160Y equals the total dose value for the column in which the cell resides. For example, location 170 in chart 160X has a dose value of 44.0 for the x-polarization exposure (process P3) and location 170 in chart 160Y has a dose value of 11.0 for the y-polarization exposure (process P4), summing to 55.0, the total dose value DT1 for that column. Each dose ratio value within a column is incremented by a selected step listed in a bottom row in chart 162. For example, the column in chart 160X, 160Y for total dose value DT1 is incremented by −2.750 mJ/cm$^2$.

The x-polarization value and y-polarization value of a mixed polarization state used is illustrated in chart 164X, 164Y in FIGS. 4 and 5, respectively, and corresponds to a particular row in charts 160X, 160Y. For example, corresponding cells 172 in charts 164X, 164Y illustrate the ratios of x-polarization and y-polarization used for each exposure. For the x-polarization exposure of process P3, 0.80 x-polarization (80%) is used, while for the y-polarization exposure of process P4, 0.2 y-polarization (20%) is used. The sum of each corresponding cell is always 1.0 (or 100%), representing sums of the ratio of x-polarization and y-polarization used.

With further regard to the processes, with reference to FIG. 4, in process P3, controller 132 controls photolithography scanner 144 to expose a location, e.g., location 170, on a photoresist using illumination having an x-polarization value (e.g., 80% x-polarization and no y-polarization (cell 172)) of a selected mixed polarization state (represented by row in charts 164X, 162X) and an x-exposure dose ratio value (in each cell of chart 162X, 44.0 for location 170) of the total dose value (columns in chart 162X). In process P4, controller 132 controls photolithography scanner 144 to expose the location, e.g., location 170, on the photoresist using illumination having a y-polarization value (e.g., 20% y-polarization and no x-polarization (cell 172)) of the selected mixed polarization state (represented by row in charts 164Y, 162Y) and a y-exposure dose ratio value (in each cell of chart 162X, 11.0 for location 170) of the total dose value (columns in chart 162Y).

In process P5, controller 132 controls photolithography scanner 144 to repeat the x-polarization value exposing and the y-polarization value exposing to achieve a range of mixed polarization states (rows in chart 162X, 164X, 162Y, 164Y in FIGS. 4 and 5) and a plurality of dose ratio values that range over extremes for the x-polarization exposure and the y-polarization exposure. In this regard, process P2 may also include selector 130 determining an increment of dose ratio value change for each repeating. In one embodiment, as shown in FIGS. 4 and 5, the range of mixed polarization states extends from an x-polarization only value to a y-polarization only value. Each repeating occurs at a different location on the photoresist.

Figure 7:
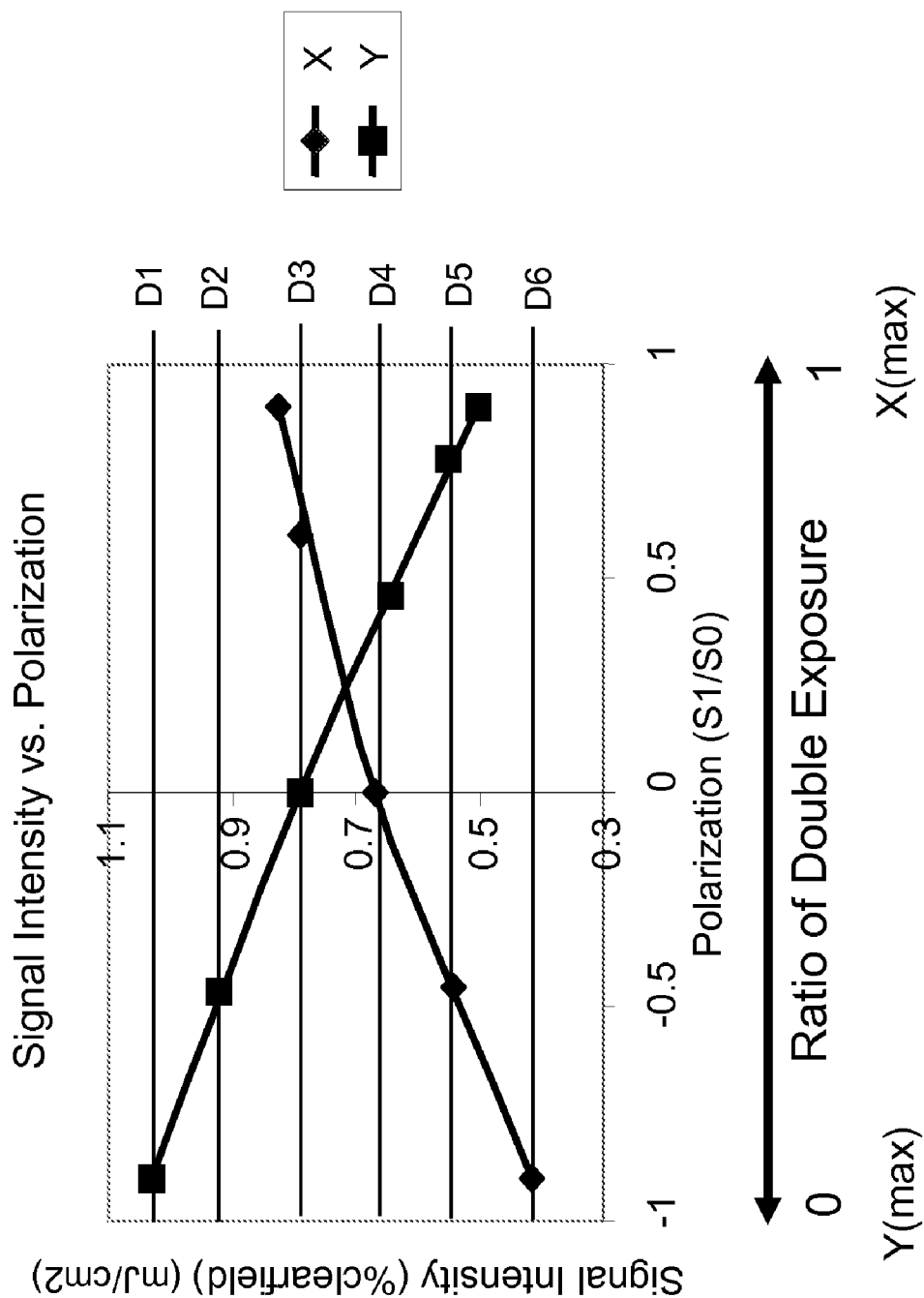
FIG. 7 shows a conceptual graphical representation of resulting data.

In process P6, monitor 134 monitors which mixed polarization states cause a change in an image printed at the different locations on the photoresist. FIG. 6 shows an illustrative resulting photoresist with those locations that printed circled. Knowing those locations, polarization monitoring system 106 can determine which mixed polarization states cause an image center to print. FIG. 7 shows a graphical representation of the resulting data illustrating how 5 data points are now achieved for each type polarization, resulting in more accuracy as to which mixed polarization states will print an image. Any number of data points for each total dose value may now be achieved by determining which effective mixed polarization state causes the image center to print. More data allows for a number of advantages such as more accurate selection of mixed polarization states for optimization of structure generation and for removal of noise. Consequently, the disclosure may aid in determination of polarization quality of both tool polarization settings (typically X and Y) on the same wafer, and reduce the need for extremely high dose values, which can damage the scanner and are often forbidden on commercial scanners. Fitting a model to the data extracts the measurement and reduces experimental error. Using multiple data points allows a polynomial, rather than just a linear, model to be used, which may better reflect the physics involved. In addition, the above-described methodology enables uniform dose steps, which may be difficult to program on most photolithography scanners.

Figure 8:
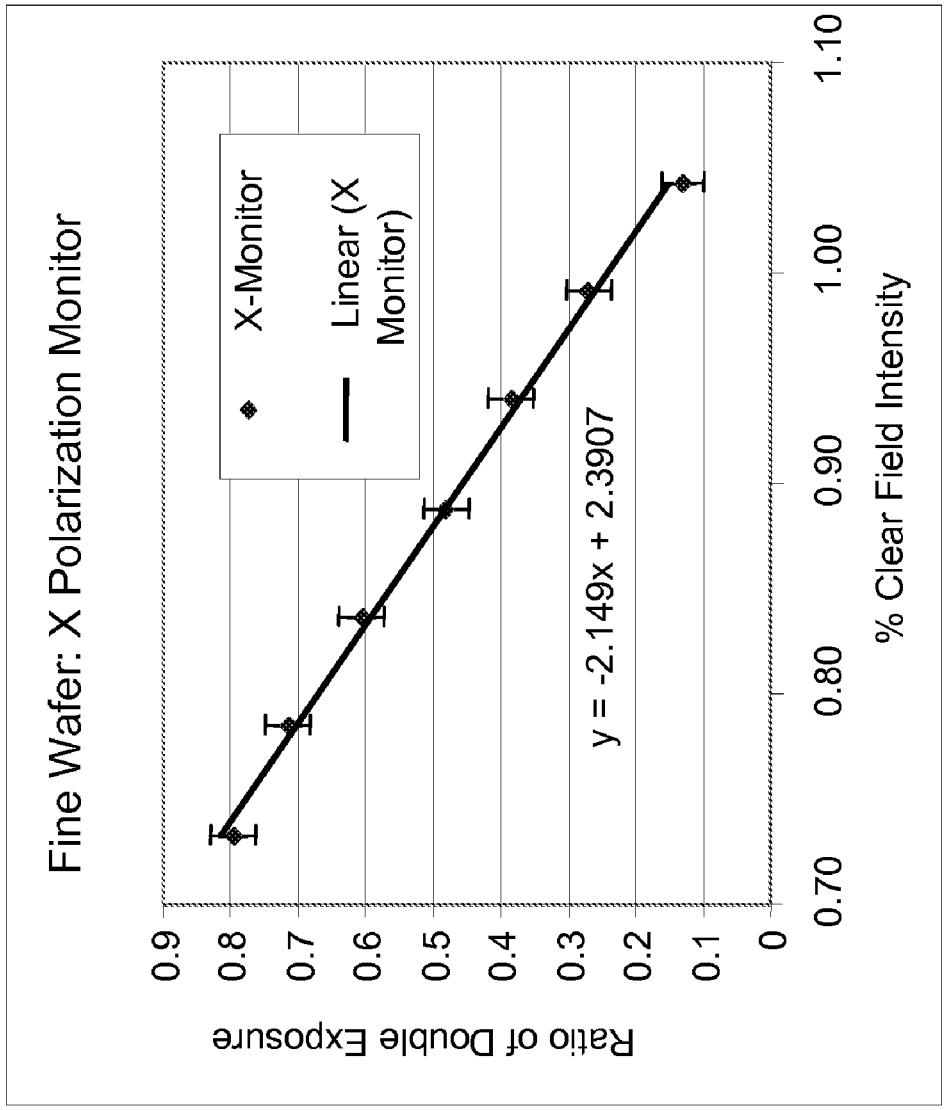
FIG. 8 shows a graphical representation of resulting data from actual experimental wafer data and using a finer subset of mixed polarization states.

FIGS. 7 and 8 illustrate data where the above-described methodology may be applied for at a finer level to obtain more accurate data. More specifically, the above-described methodology may be applied or re-applied for a range of mixed polarization states that extends between at least one of: a) an x-polarization value less than an x-polarization only value and b) a y-polarization value less than a y-polarization only value. In other words, the methodology may use the exposing processes and the repeating using a subset of the range of mixed polarization states. FIG. 8 shows a chart illustrating more precise data acquisition using a subset of mixed polarization states.

As will be appreciated by one skilled in the art, the present disclosure may be embodied as a system, method or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As discussed herein, various systems and components are described as "obtaining" data (e.g., dose values, etc.). It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
providing a photolithography scanner capable of providing illumination over a range of mixed polarization states between extremes of x-polarization and y-polarization;
selecting a set of total dose values, and for each total dose value:
exposing a location on a photoresist using illumination having an x-polarization value with an x-exposure dose ratio value of the total dose value,
exposing the location on the photoresist using illumination having a y-polarization value with a y-exposure dose ratio value of the total dose value, and
repeating the x-polarization value exposing and the y-polarization value exposing to achieve a range of mixed polarization states and a plurality of dose ratio values that range over extremes for the x-polarization exposure and the y-polarization exposure, each repeating occurring at a different location on the photoresist; and
monitoring which mixed polarization states causes a change in an image printed at the different locations in the photoresist.

2. The method of claim 1, wherein the selecting includes:
determining a plurality of dose values; and
converting each of the plurality of dose values to a total dose value based on a clearing dose of the photoresist (E0), an overdose factor of the photolithography scanner and an effective pinhole size of a mask used.

3. The method of claim 1, wherein the range of mixed polarization states extends from an x-polarization only value to a y-polarization only value.

4. The method of claim 1, wherein the range of mixed polarization states extends between at least one of an x-polarization value less than an x-polarization only value and a y-polarization value less than a y-polarization only value.

5. The method of claim 1, wherein the selecting further includes determining an increment of dose ratio value change for each repeating.

6. The method of claim 1, further comprising repeating the exposing processes and the repeating using a subset of the range of mixed polarization states.

7. A system comprising:
a photolithography scanner capable of providing illumination over a range of mixed polarization states between extremes of x-polarization and v-polarization;
a dose selector for selecting a set of total dose values;
a controller for controlling the photolithography scanner to perform for each total dose value:
exposing a location on a photoresist using illumination having an x-polarization value with an x-exposure dose ratio value of the total dose value,
exposing the location on the photoresist using illumination having a y-polarization value with a y-exposure dose ratio value of the total dose value, and
repeating the x-polarization value exposing and the y-polarization value exposing to achieve a range of mixed polarization states and a plurality of dose ratio values that range over extremes for the x-polarization exposure and the y-polarization exposure, each repeating occurring at a different location on the photoresist; and
a monitor for monitoring which mixed polarization states causes a change in an image printed at a location in the photoresist.

8. The system of claim 7, wherein the selector determines a plurality of dose values, and converts each of the plurality of dose values to a total dose value based on a clearing dose of the photoresist (E0), an overdose factor of the photolithography scanner and an effective pinhole size of a mask used.

9. The system of claim 7, wherein the range of mixed polarization states extends from an x-polarization only value to a y-polarization only value.

10. The system of claim 7, wherein the range of mixed polarization states extends between at least one of an x-polarization value less than an x-polarization only value and a y-polarization value less than a y-polarization only value.

11. The system of claim 7, wherein the selector further determines an increment of dose ratio value change for each repeating.

12. The system of claim 7, wherein the controller repeats the exposing processes and the repeating using a subset of the range of mixed polarization states.

13. A program product stored on a non-transitory computer-readable medium, which when executed by a computer system, determines mixed polarization states that print an image using a given mask and a photolithography scanner capable of providing illumination over a range of mixed polarization states between extremes of x-polarization and y-polarization, the program product comprising program code configured to perform the following:
select a set of total dose values, and for each total dose value:
control exposing of a location on a photoresist using illumination having an x-polarization value with an x-exposure dose ratio value of the total dose value,
control exposing the location on the photoresist using illumination having a y-polarization value with a y-exposure dose ratio value of the total dose value,
repeat the x-polarization value exposing and the y-polarization value exposing to achieve a range of mixed polarization states and a plurality of dose ratio values that range over extremes for the x-polarization exposure and the y-polarization exposure, each repeating occurring at a different location on the photoresist; and
monitor which mixed polarization states causes a change in an image printed at the different locations in the photoresist.

14. The program product of claim 13, wherein the selecting code further:
determines a plurality of dose values; and
converts each of the plurality of dose values to a total dose value based on a clearing dose of the photoresist (E0), an overdose factor of the photolithography scanner and an effective pinhole size of a mask used.

15. The program product of claim 13, wherein the range of mixed polarization states extends from an x-polarization only value to a y-polarization only value.

16. The program product of claim 13, wherein the range of mixed polarization states extends between at least one of an x-polarization value less than an x-polarization only value and a y-polarization value less than a y-polarization only value.

17. The program product of claim 13, wherein the select code further determines an increment of dose ratio value change for each repeating.

18. The program product of claim 13, wherein the repeating code further repeat the exposing processes and the repeating using a subset of the range of mixed polarization states.

* * * * *